United States Patent
Kim et al.

(10) Patent No.: US 6,796,723 B2
(45) Date of Patent: Sep. 28, 2004

(54) SUBMOUNT FOR OPTO-ELECTRONIC MODULE AND PACKAGING METHOD USING THE SAME

(75) Inventors: Sung-il Kim, Daejon (KR); Jong-won Lim, Seoul (KR); Hae-cheon Kim, Daejon (KR)

(73) Assignee: Electronics and Telecommunications Research Institute (KR)

( * ) Notice: Subject to any disclaimer, the term of this patent is extended or adjusted under 35 U.S.C. 154(b) by 245 days.

(21) Appl. No.: 10/071,126

(22) Filed: Feb. 8, 2002

(65) Prior Publication Data

US 2003/0099444 A1 May 29, 2003

(30) Foreign Application Priority Data

Nov. 24, 2001 (KR) ........................................ 2001-73570

(51) Int. Cl.⁷ ................................................. G02B 6/36
(52) U.S. Cl. ....................................................... 385/88
(58) Field of Search .............................. 385/88, 89, 92, 385/94, 139, 76, 77

(56) References Cited

U.S. PATENT DOCUMENTS

| | | | | |
|---|---|---|---|---|
| 4,707,067 A | * | 11/1987 | Haberland et al. | ............ 385/90 |
| 5,179,609 A | * | 1/1993 | Blonder et al. | ............... 385/89 |
| 5,222,175 A | * | 6/1993 | Tatoh | .......................... 385/93 |
| 5,909,523 A | * | 6/1999 | Sakaino et al. | ............... 385/49 |
| 6,072,815 A | | 6/2000 | Peterson | ...................... 372/36 |
| 6,240,113 B1 | * | 5/2001 | Peterson | ...................... 372/36 |
| 6,403,948 B1 | * | 6/2002 | Tachigori | ............... 250/227.11 |

* cited by examiner

Primary Examiner—Ashok Patel
Assistant Examiner—Peter Macchiarolo
(74) Attorney, Agent, or Firm—Blakely Sokoloff Taylor & Zafman

(57) ABSTRACT

A submount for an opto-electronic module for outputting light incident from an opto-electronic device as an electrical signal is provided. The submount includes a dielectric material and an interconnection line. The dielectric material has a polygonal shape including a front face and a bottom face. The interconnection line is attached to the front face and the bottom face of the dielectric material. The interconnection line has a coplanar waveguide structure and is electrically to the opto-electronic device to output signals from the opto-electronic device.

1 Claim, 4 Drawing Sheets

SUBMOUNT FOR OPTO-ELECTRONIC MODULE AND PACKAGING METHOD USING THE SAME

BACKGROUND OF THE INVENTION

1. Field of the Invention

The present invention relates to a submount for an opto-electronic module and a packaging method using the same, and more particularly, to a submount for an opto-electronic module suitable for high-speed transmission and a packaging method using the same.

2. Description of the Related Art

Recently, as the demand for high-quality communication service increases sharply, the transmission speed of optical communication systems becomes very rapid. Now, it is possible to build a comprehensive network having an ultra-high speed broad-band width using opto-electronic modules having a unit transmission speed of 2.5 Gbps in systems having a transmission speed of about 40–100 Gbps by Wavelength Division Multiplexing (WDM). However, opto-electronic modules having the minimum unit transmission speed of 10 Gbps are required to increase the efficiency of the configuration of optical communication systems having a transmission speed of 160–640 Gbps.

FIG. 1 is an exploded perspective view of a general photo-receiver module including a general submount for an opto-electronic module. Referring to FIG. 1, a submount 104, to which an opto-electronic device 102 such as a photodiode sticks, is attached to a substrate 106. The submount 104 electrically connects the opto-electronic device 102 to an electronic device (not shown) on the substrate 106 using wires or ribbon bonding. A plurality of signal lines 108 are installed on the substrate 106 for such electrical connection. An amplifier 110 for amplifying an electrical signal output from the opto-electronic device 102 to a predetermined level or above is attached to the substrate 106. The amplifier 110 electrically contacts the plurality of signal lines 108 on the substrate 106. The substrate 106, to which the submount 104 and the amplifier 110 are attached, is put into a metal shield case 112 and then the metal shield case 112 is covered with a cover 113. An optical fiber 114, which forms a path of light incident on the opto-electronic device 102, penetrates through the metal shield case 112 and is aligned with the opto-electronic device 102 so that light is properly incident on the opto-electronic device 102. For this, a fiber support 116 is attached to the substrate 106 to support the optical fiber 114.

In this general photo-receiver module, the submount 104 is connected to the electronic device (not shown) mainly using bonding wires. However, if the general photo-receiver module having the above-described configuration is a photo-receiver module having a transmission speed of 2.5 Gbps or more, signal distortion occurs on interconnection lines between the opto-electronic device 102 and the electronic device (not shown) due to parasitic components of the bonding wires. As a result, the reliability of signal transmission and the reliability of module operation are reduced. Moreover, there is a limit in that additional interconnection lines installed on the submount 104 are not used in a photo-receiver module requiring high-speed operation of over 2.5 Gbps.

SUMMARY OF THE INVENTION

To solve the above-described problems, it is a first object of the present invention to provide a submount for an opto-electronic module suitable for high-speed transmission of over 2.5 Gbps.

It is a second object of the present invention to provide a packaging method using the submount for an opto-electronic module.

Accordingly, to achieve the first object, there is provided a submount for an opto-electronic module for outputting light incident from an opto-electronic device as an electrical signal. The submount includes a dielectric material having a polygonal shape with a front face and a bottom face, and an interconnection line having a coplanar waveguide structure, attached to the front face and the bottom face of the dielectric material, and electrically connected to the opto-electronic device to output signals from the opto-electronic device.

It is preferable that the interconnection line having a coplanar waveguide structure includes a plurality of interconnection lines, which are spaced apart from each other. The the interconnection lines may be a first ground line, a signal transmission line, a second ground line, and a bias application line, respectively, which are sequentially disposed. It is preferable that the the opto-electronic device is attached to a portion of the second ground line, which is attached to the front face of the dielectric material. The opto-electronic device attached to the second ground line is preferably connected to the signal transmission line and the bias application line via wires.

It is preferable that the distance between a portion of the signal transmission line and a portion of the second ground line on the bottom face of the dielectric material is greater than the distance between a portion of the signal transmission line and a portion of the second ground line on the front face of the dielectric material.

To achieve the second object, there is provided a packaging method using a submount for an opto-electronic module including a dielectric material and an interconnection line having a coplanar waveguide structure. An opto-electronic device is attached to the interconnection line to be electrically connected to the interconnection line. The interconnection line, to which the opto-electronic device is attached, is attached to a conductive interconnection line of a substrate.

Attaching the interconnection line to the conductive interconnection line of the substrate is performed using conductive epoxy.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Hereinafter, preferred embodiments of the present invention will be described in detail with reference to the attached drawings. However, the preferred embodiments of the present invention can be modified into various other forms, and the scope of the present invention must not be interpreted as being restricted to the preferred embodiments.

Figure 1:
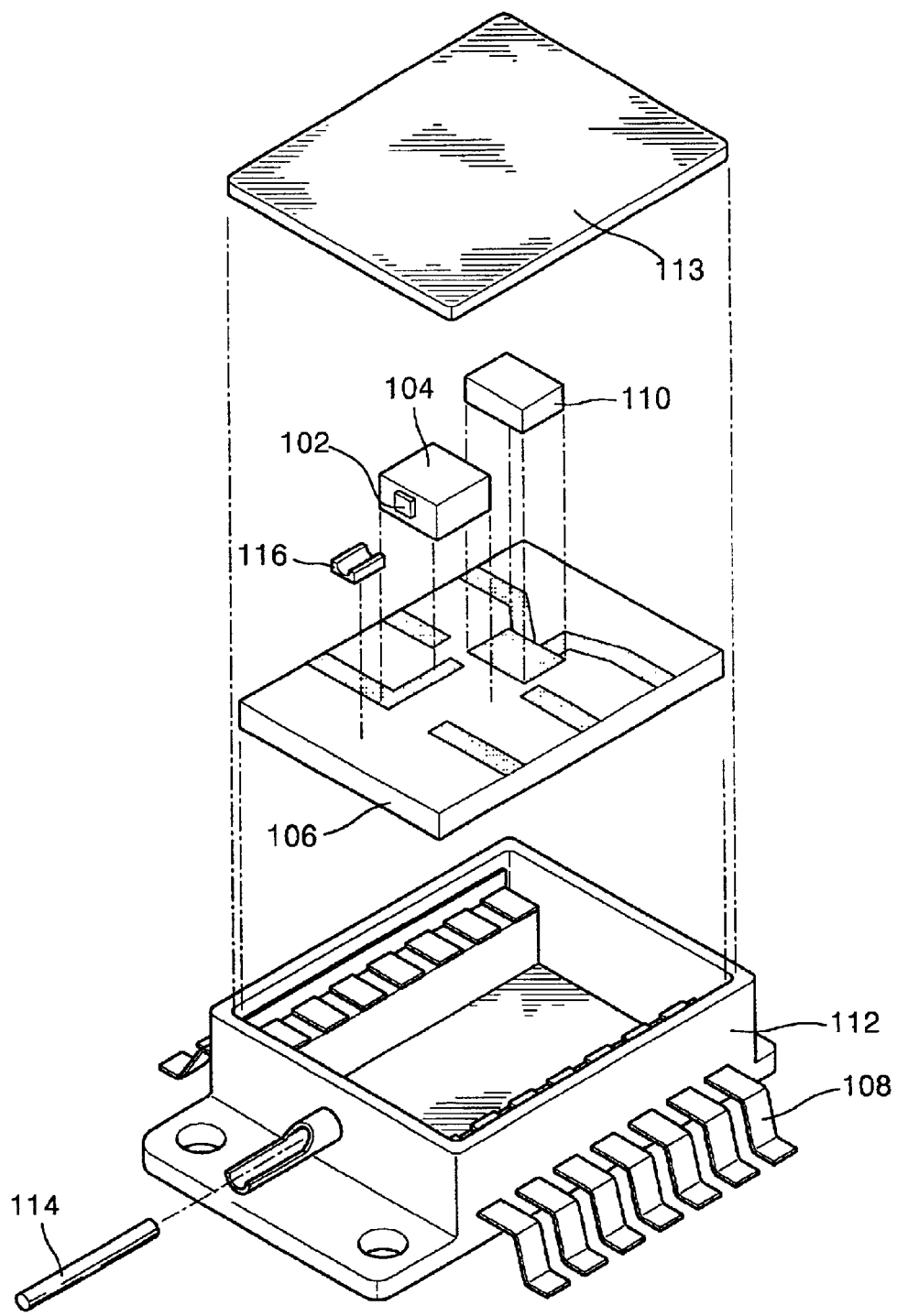
FIG. 1 is an exploded perspective view of a general photo-receiver module including a general submount for an opto-electronic module.
Figure 2:
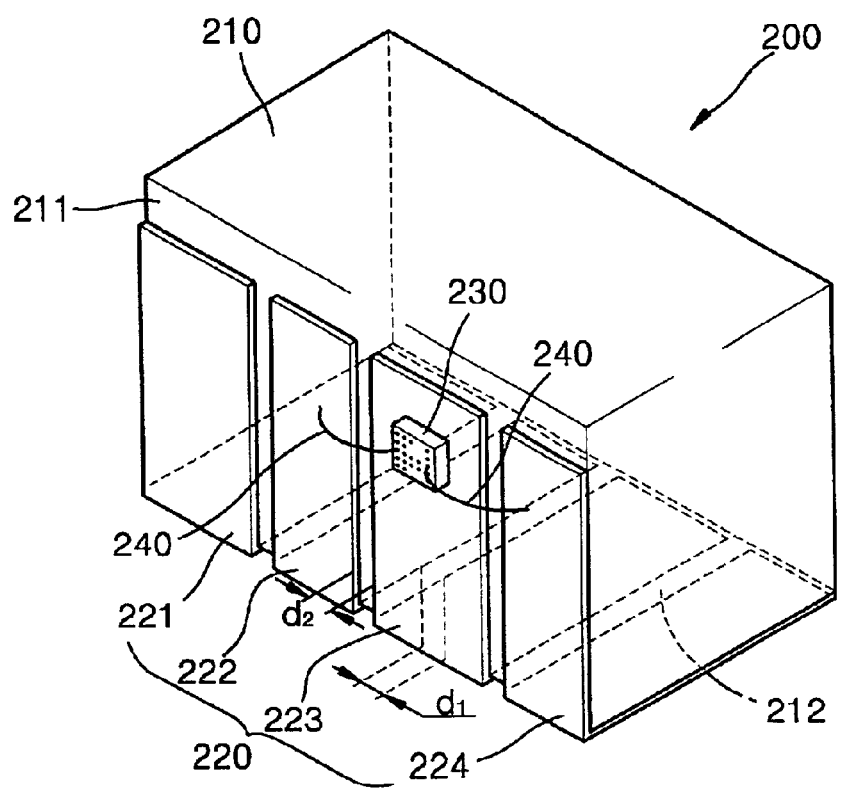
FIG. 2 is a perspective view of a submount for an opto-electronic module according to the present invention.

FIG. 2 is a perspective view of a submount for an opto-electronic module according to the present invention. Referring to FIG. 2, a submount 200 for an opto-electronic module includes a dielectric material 210 and an interconnection line 220.

The dielectric material 210 is formed of alumina ceramic or quartz crystal and has a polygonal shape including a front face 211 and a bottom face 212, which may be perpendicular to each other or disposed at a predetermined angle. If the dielectric material 210 is rectangular, the front face 211 and the bottom face 212 are perpendicular to each other.

The interconnection line 220 has a coplanar waveguide (CPW) structure and is attached to the front face 211 and the bottom face 212 of the dielectric material 210. The interconnection line 220 is electrically connected to an opto-electronic device 230 and includes a plurality of interconnection lines, which are spaced apart from each other, to output a signal from the opto-electronic device 230. In other words, a first ground line 221, a signal transmission line 222, a second ground line 223, and a bias application line 224 are in a row disposed on the front face 211 and the bottom face 212 of the dielectric material 210. The opto-electronic device 230 is attached to the second ground 223 and is electrically connected to the signal transmission line 222 and the bias application line 224 via wires 240. In this case, the surface of the second ground line 223, which is an electrical reference plane of an electrical signal applied to the wires 240, is disposed on the base planes of the wires 240. Thus, effects caused by parasitic components such as inductance occurring from the wires 240 are minimized. An electrical signal output from the opto-electronic device 230, i.e., current 1, flows into a portion of the signal transmission line 222 on the front face 211 of the dielectric material 210 via the wires 240 and is output to the outside via a portion of the signal transmission line 222 on the bottom face 212 of the dielectric material 210.

The distance $d_1$ between portions of the signal transmission line 222 and the second ground line 223 on the bottom face 212 of the dielectric material 210 is greater than the distance $d_2$ between portions of the signal transmission line 222 and the second ground line 223 on the front face 211 of the dielectric material 210. This is to uniformly concentrate an electric field on the surface of the signal transmission line 222. In other words, the portion of the signal transmission line 222 on the front face 211 of the dielectric material 210 contacts air and a dielectric material. However, the portion of the signal transmission line 222 on the bottom face 212 of the dielectric material 210 contacts the dielectric material 210 included in the submount 200 upward and a dielectric material (not shown) included in a substrate (not shown) to be attached downward. As a result, the concentration of the electric field is increased on the surface of the signal transmission line 222 on the bottom surface 212 of the dielectric material 210. Thus, in order to coincide with the concentration of the electric field on the surface of the signal transmission line 222 on the front face 211 of the dielectric material 210, the distance $d_1$ between the portions of the signal transmission line 222 and the second ground line 223 on the bottom face 212 of the dielectric material 210 must be increased.

Figure 3:
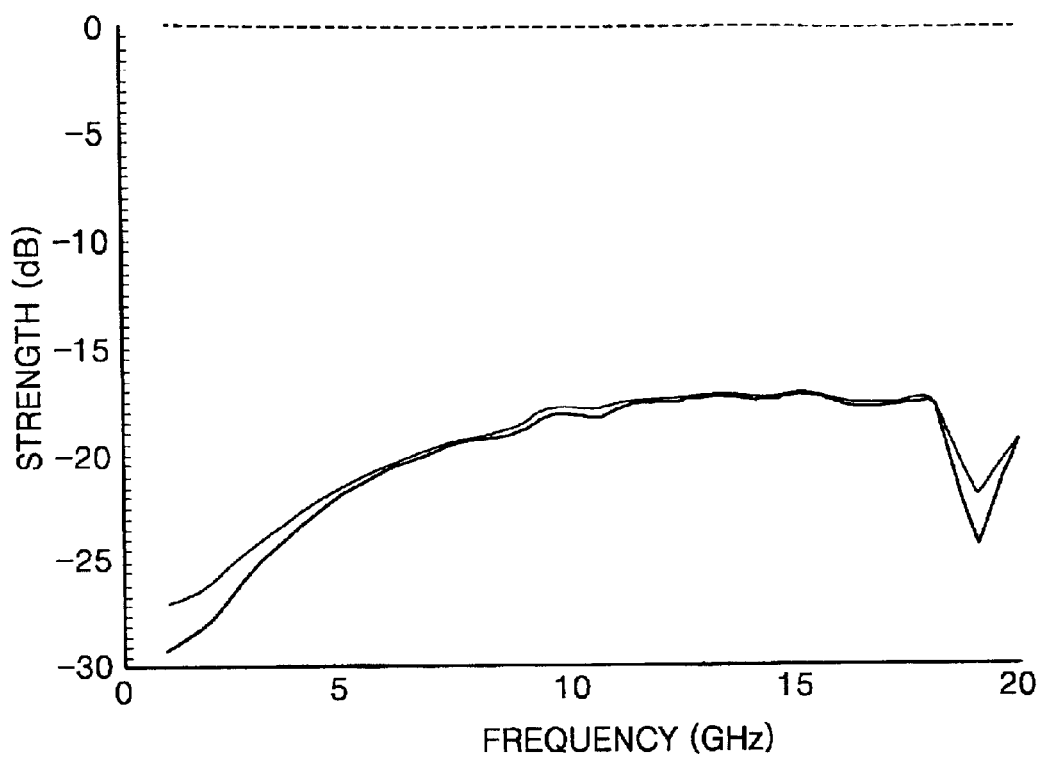
FIG. 3 is a graph showing transmission loss and reflection loss of a submout for an opto-electronic module according to the present invention.

FIG. 3 is a graph showing transmission loss and reflection loss of a submout for an opto-electronic module according to the present invention. In FIG. 3, reflection loss (marked with a solid line) and transmission loss (marked with a dotted line), which were measured in a 2-port scattering parameter system, are shown. Here, the reflection loss represents that an electrical signal applied to the submount is not transmitted to the end of the submount and is reflected due to parasitic components on interconnection lines. The transmission loss represents that the electrical signal is transmitted to the end of the submount without distortion.

As shown in FIG. 3, in the submout according to the present invention, a reflection loss up to a frequency of 20 GHz is about −15 dB or less and a transmission loss up to a frequency of 20 GHz is about −1 dB or more. Thus, it is noticed that the submout is suitable for the transmission of high-speed signal of 10 Gbps.

Figure 4:
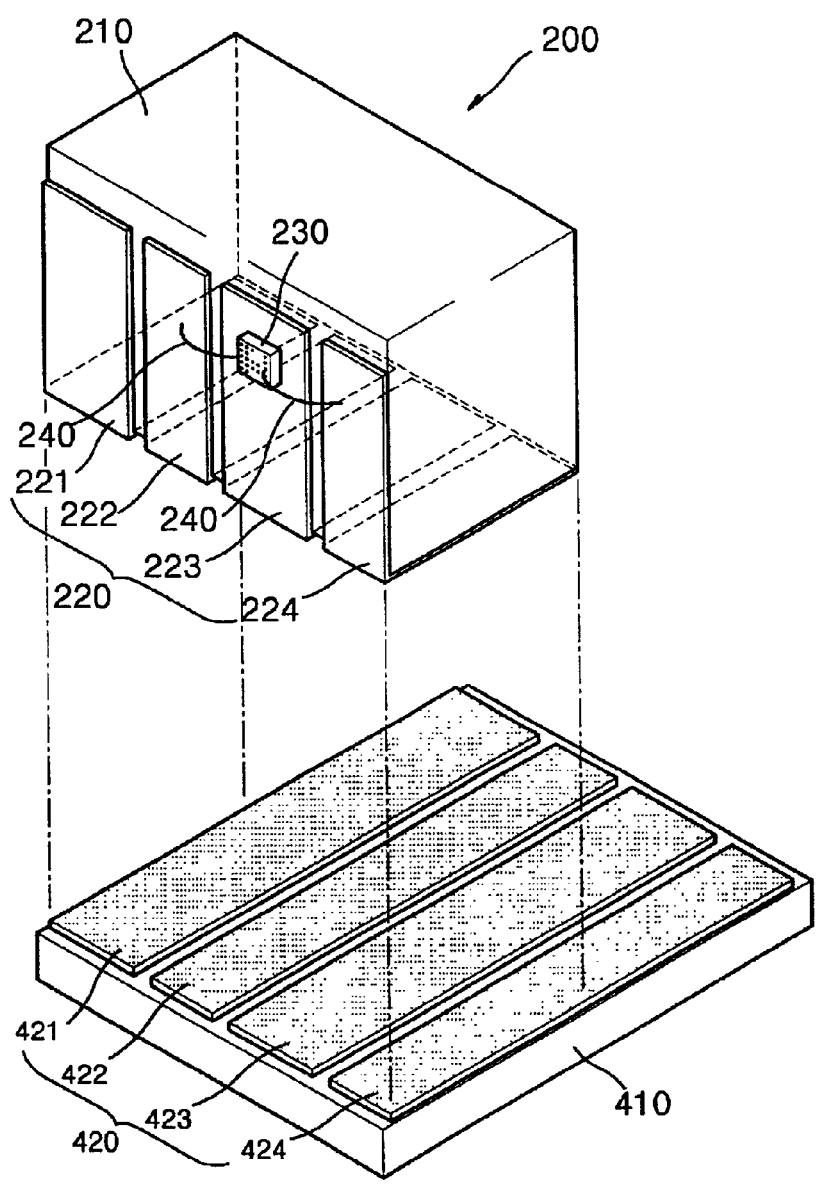
FIG. 4 is an exploded perspective view explaining a packaging method using a submount for an opto-electronic module according to the present invention.

FIG. 4 is an exploded perspective view explaining a packaging method using a submount for an opto-electronic module according to the present invention. Referring to FIG. 4, a submount 200 includes a dielectric material 210 and an interconnection line 220. The interconnection line 220 has a coplanar waveguid and a plurality of interconnection lines, which are a first ground line 221, a signal transmission line 222, a second ground line 223, and a bias application line 224. The first ground line 221, the signal transmission line 222, the second ground line 223, and the bias application line 224 are spaced apart from each other on a front face and a bottom face of the dielectric material 210. An opto-electronic device 230 is attached to the second ground line 223 and is electrically connected to the signal transmission line 222 and the bias application line 224 via wires 240. The interconnection line 220 of the submount 200 is attached to a substrate interconnection line 420 on a substrate 410, which is formed of a dielectric material. Here, the substrate interconnection line 420 includes a first substrate ground line 421, a substrate signal transmission line 422, a second substrate ground line 423, and a substrate bias application line 424. The first ground line 221, the signal transmission line 222, the second ground line 223, and the bias application line 224 of the submount 200 are directly adhered to the first substrate ground line 421, the substrate signal transmission line 422, the second substrate ground line 423, and the substrate bias application line 424, respectively. The adhesion is performed using a conductive material, e.g., conductive epoxy.

As described above, in a submount for an opto-electronic module according to the present invention, an interconnection line of the submount has a coplanar waveguide structure, which has an excellent electrical property of high-speed transmission of signals. Also, in a packaging method, interconnection lines of the submount are directly adhered to interconnection lines of a substrate. Thus, it is easy to package the submount.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. A submount for an opto-electronic module for outputting light incident from an opto-electronic device as an electrical signal, the submount comprising:

a dielectric material having a polygonal shape with a front face and a bottom face; and an interconnection line having a coplanar waveguide structure, attached to the front face and the bottom face of the dielectric material, and electrically connected to the opto-electronic device to output signals from the opto-electronic device, the coplanar waveguide structure includes a plurality of interconnection lines, which are spaced apart from each other, the interconnection lines are a first ground line, a signal transmission line, a second ground line, and a bias application line, respectively, which are sequentially disposed, wherein the opto-electronic device is attached to a portion of the second ground line, which is attached to the front face of the dielectric material, and the opto-electronic device is also connected to the signal transmission line and the bias application line via wires, and wherein the distance between a portion of the signal transmission line and a portion of the second ground line on the bottom face of the dielectric material is greater than the distance between a portion of the signal transmission line and a portion of the second ground line on the front face of the dielectric material.

* * * * *